United States Patent [19]

Greil et al.

[11] Patent Number: 5,066,093
[45] Date of Patent: Nov. 19, 1991

[54] METHOD FOR ADJUSTING AND FIXING A LENS AND OPTICAL COUPLING ARRANGEMENT MANUFACTURED THEREWITH

[75] Inventors: Andreas Greil; Franz Taumberger, both of Munich, Fed. Rep. of Germany

[73] Assignee: Siemens Aktiengesellschaft, Munich, Fed. Rep. of Germany

[21] Appl. No.: 490,448

[22] Filed: Mar. 8, 1990

[30] Foreign Application Priority Data

Mar. 22, 1989 [DE] Fed. Rep. of Germany ....... 3909552

[51] Int. Cl.⁵ .................................................. G02B 6/32
[52] U.S. Cl. .......................................... 385/33; 385/52
[58] Field of Search ................ 350/96.15, 96.17, 96.20; 250/552, 227.14, 227.15, 227.17, 227.24; 357/17, 19, 30, 74, 80

[56] References Cited

U.S. PATENT DOCUMENTS 4,474,306 10/1984 Nakauchi et al. .................... 220/359
4,707,067 11/1987 Haberland et al. ................ 350/96.20
4,741,796 5/1988 Althaus et al. .................... 156/272.4
4,762,386 8/1988 Gordon et al. .................... 350/96.20
4,767,171 8/1988 Keil et al. ......................... 350/96.20
4,776,659 10/1988 Mruk ............................... 350/96.15
5,013,111 5/1991 Tilly et al. ........................ 350/96.20

FOREIGN PATENT DOCUMENTS 0100086 2/1984 European Pat. Off. .

Primary Examiner—Frank Gonzalez
Assistant Examiner—Phan T. Heartney
Attorney, Agent, or Firm—Hill, Van Santen, Steadman & Simpson

[57] ABSTRACT

A method for adjusting and fixing a lens in front of an opto-electronic component which is arranged on a carrier comprises mounting the lens with a high precision and fixing it for a long-term stability. The lens is held at an end face of the small metal tube, and the small metal tube is mounted on the carrier by a metal clip, which is first welded to the carrier, and the tube is subsequently welded to the clip in a point-by-point manner.

19 Claims, 1 Drawing Sheet

METHOD FOR ADJUSTING AND FIXING A LENS AND OPTICAL COUPLING ARRANGEMENT MANUFACTURED THEREWITH

BACKGROUND OF THE INVENTION

The present invention is directed to a method for adjusting and fixing a lens in front of an optical-electronic semiconductor component so that they are optically coupled to one another as the component is arranged on a carrier and to the coupling arrangement manufactured by this method.

In opto-electronic transmission and/or reception modules having light waveguide transmission links for optical communication transmission, there are problems in optically coupling the opto-electronic semiconductor component to a light waveguide in a desire way. The coupling of the opto-electronic component and a mono-mode or multi-mode fiber will occur via a beam-free optics in a module having at least one lens. Given this employment, a lens in the submicrometer region, i.e. having an adjustment tolerance of <0.2 μm, must be fine-adjusted and fixed in front of the opto-electronic semiconductor component, which may be, for example, a laser diode.

It is known for manufacturing such coupling arrangements to arrange, for example, a light waveguide having a hemispherical termination or a lens, for example a spherical lens, on a carrier of, for example, silicon, and to adjust it in a liquid solder relative to the component. Such an arrangement is shown in U.S. Pat. No. 4,741,796, which is based on the same German Application as EP-A-0 204 224.

The adjustment of lenses, of spherical lenses preferably employed for this purpose for cost reasons, as well, however, is difficult in the liquid material. Moreover, the solidity of such a connection after cooling and solidification of the solder is not always guaranteed, particularly in view of the required durability of such an optical coupling arrangement that is especially sensitive to mechanical stresses.

SUMMARY OF THE INVENTION

The object of the present invention is to provide an improved method for adjusting and fixin-g of the lens relative to the component in such a manner that a high optical coupling efficiency is guaranteed in an optical coupling arrangement manufactured according to this method on the basis of an exact adjustment and that a long-time stability is guaranteed with a rigid, mechanical stable connection.

To accomplish these objects, the present invention is directed to a method and to the arrangement produced by the method. The method comprises holding the lens in an end face of a small metal tube, positioning the small metal tube in front of the opto-electronic semiconductor component, providing a metal clip to hold the tube in front of the component and welding this clip after a first adjustment to a carrier on which the component is mounted, following the first welding step, providing a further adjustment procedure of the small metal tube relative to the component and then welding point-by-point the small metal tube to the metal clip in a plurality of successive welding steps, with each welding step being followed by a further adjustment procedure.

The arrangement which is produced by the method comprises a carrier supporting the opto-electronic component, a lens being held in the end of a small metal tube, said small metal tube being held by a clip on the carrier with the lens being in front of the electro-optical component, said clip being welded to the metal carrier and the small metal tube, together with the lens, being secured to the metal clip by spot welds.

The invention is based on the perception that, first, a weld connection represents a type of fastening that is extremely mechanically stable but, on the other hand, it is impossible to do a welding without any warping. Proceeding on the basis of this perception, the spot welds used in the method of the present invention are placed such that an unavoidable warping is always oppositely directed. The clip, that is expediently composed of a metal, is thereafter designed so that the small tube that has an intrinsic function of the lens holder and that is expediently composed of a metal, always form a gap-free point of contact with the metal clip at a circumference of the tube during adjustment. This is achieved by the radius of the metal clip.

The metal clip expediently has its coefficient of thermal expansion matched to the coefficient of expansion of the carrier or sub-carrier, which is preferably composed of copper. For the purpose of adjusting and fixing the lens or, respectively, the small metal tube that carries the lens, the carrier is mounted on a mounting element.

The weld connection between the metal clip, for example which will have a nickel surface, and a carrier, for example a gold-plated copper, is achieved by a through-welding of the metal clip with a laser beam.

The lens, preferably a spherical lens, is pressed in, glazed in, glued in, soldered in, or shrunken in a small metal tube. The lens can also be on an end of a fiber which is held in the tube.

The small metal tube is welded fast in front of the opto-electronic semiconductor component in a metal clip after the first adjustment process at the carrier of the opto-electronic component with a laser welding method in the form of a plurality of spot welds. The small metal tube is thereafter held in a tightening forceps that can be adjusted in the direction of the x, y and z axis.

Thereafter, the lens is again adjusted to an optimum position and the first spot weld is placed at a point of contact between the metal clip and small metal tube. The lens is then again adjusted to an optimum position in a welding warp that may be potentially identified is derived. The next spot welds are welded in sequence, whereby the incoupling is corrected after every weld. The warping becomes less and less after every weld and, thus, does not require readjustment.

After placing the last spot weld, moreover, the position of the lens can again be finally re-corrected via the lever action of the small tube and clip.

The advantages achieved with the invention particularly comprise therein that great structuring tolerances can be bridged with this adjustment method. Over and above this, the weld fixing has a far better long-term stability compared to the solder fixing. Added thereto is that the design is selected so that the manipulation and fixing welding can be realized well in an open module housing.

Moreover, one has a step-down in the adjustment with the welding forceps or manipulator and can be adjusted exactly to 0.1 μ with little cost. It is also advantageous that the component carrier, for example a laser carrier, can be more simply designed or that the proposed adjustment method can also be realized, given traditional component carriers. In addition, simple and, thus, less expensive component parts can be employed for manufacturing the opto-electronic coupling arrangement.

Another advantage of the method of the present invention comprises that the covering of the optical active surface of the lens is avoided, due to a purely mechanical joining of the lens to the small metal tube as a mount, mainly due to the possibility of pressing or, respectively, shrinking of the lens into the metal tube.

Other advantages and features of the invention will be readily apparent from the following description of the preferred embodiments, the drawings and claims.

DESCRIPTION OF THE PREFERRED EMBODIMENTS

Figure 1:
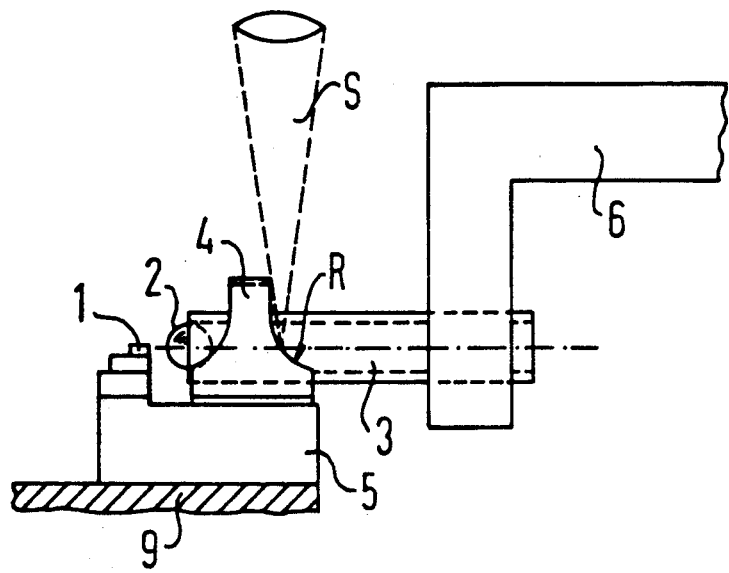
FIG. 1 is a side view of the coupling arrangement of the present.
Figure 2:
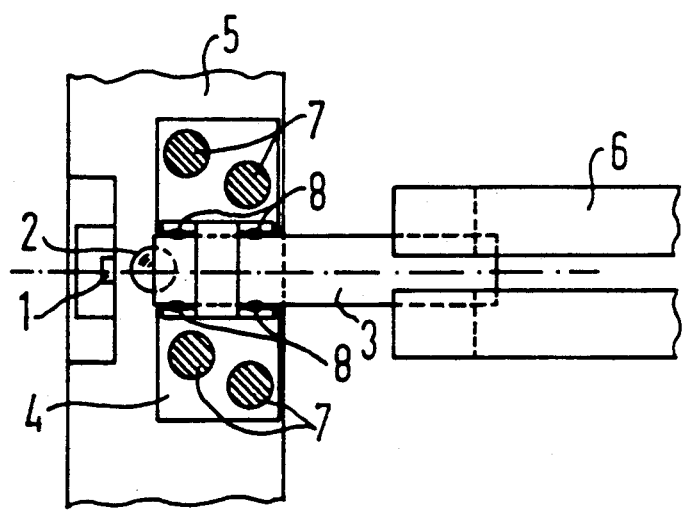
FIG. 2 is a plan view of the coupling arrangement of FIG. 1.

The principles of the present invention are that the optical coupling arrangement shown in FIGS. 1 and 2 is essentially composed of a lens 2, which is a spherical lens in the exemplary embodiment, and is adjusted and fixed on a carrier 5 in front of an opto-electronic semiconductor component 1, which may be either a laser diode or a phototransistor. The carrier 5 is preferably composed of copper and is secured on a mounting element 9 when the adjustment and fixing process is carried out. A tightening forceps or manipulator 6, which is adjustable in a direction of the x, y and z axis, is employed as an adjustment mechanism in the implementation of the method. The welding of the individual parts to be fixed is undertaken with the assistance of a laser beam S and expediently occurs in a point fashion. The spherical lens 2 is secured in the end face of a small metal tube 3 that is expediently constructed as a thin wall tube. A clip 4 is inserted over the small metal tube 3, and this clip 4 is expediently composed of a metal. After the small metal tube 3 with the lens 2 is adjusted to the optimum light incoupling in front of the component 1, the metal clip 4 has its laterally extending feet or flanges welded fast on the carrier 5, namely by a plurality of laser spot welds 7.

The lens 2 in the small metal tube 3 is then again adjusted to the optimum light-incoupling between the optical component 1 and is adjusted with the assistance of the tightening forceps 6. The small metal tube is then fixed to the metal clip 4 with laser spot welds 8. This procedure is repeated several times until enough laser spot welds 8 have been placed in order to guarantee the required durable fixing of the lens 2, given optimum adjustment of the coupling arrangement. The spot welds 8 are thereby placed such that the warping occurring during each spot welding is always oppositely directed. Moreover, the clip 4 is shaped such that a gap-free point of contact for welding of the tube 3 to the clip 4 is always formed at the circumference during the step-by-step adjustment of the small metal tube. This is advantageously achieved in that the metal clip 4 is designed so that the legs thereof proceed from a common starting point and expand radially outward with a radius R (see FIG. 1) in a downward direction toward the lateral flanges or feet, which are fastening parts that are secured to the carrier 5 by the laser spot welds 7.

The invention is not limited to the illustrated exemplary embodiment. The optimum electronic semiconductor component need not necessarily be a light-emitting component. It may be a light receiver, for example a phototransistor or a photodiode. Moreover, it may be advantageous to secure to the lens in a small metal tube, such as a component end part of a light waveguide.

An optical coupling arrangement of the present invention is preferably employed as a component part in an opto-electronic transmission and/or reception module.

Although various minor modifications may be suggested by those versed in the art, it should be understood that we wish to embody within the scope of the patent granted hereon all such modifications as reasonably and properly come within the scope of our contribution to the art.

We claim:

1. A method for adjusting and fixing a lens in front of an opto-electronic semiconductor component, said lens and component being optically coupled to one another and arranged on a carrier, said method comprising providing a carrier having the electro-optical component secured thereto, providing a small metal tube having a lens provided in an end face of the tube, providing a metal clip, positioning the small metal tube with the lens positioned in the desired position in front of the opto-electronic semiconductor component, positioning the metal clip on said tube and welding the clip after this first adjustment procedure to the carrier, then performing a second follow-up adjustment procedure of the small metal tube followed by a spot welding point-by-point of the small metal tube to the metal clip and repeating these steps of further adjustment with further spot welding to complete the securing of the tube in the clip.

2. A method according to claim 1, wherein the metal clip is shaped to provide a gap-free point of contact between the circumference of the small metal tube and the metal clip during the step-by-step adjustment thereof.

3. A method according to claim 2, wherein the metal clip is shaped with legs thereof proceeding from a common starting point radially expanding in a downward direction to lateral flanges, which are fastened to the carrier.

4. A method according to claim 3, wherein the step of providing the small metal tube, the metal clip and the carrier select the materials of the small metal tube, the clip and carrier to have matching coefficients of thermal expansion.

5. A method according to claim 2, wherein the step of providing the small metal tube, the metal clip and the carrier provides a tube, clip and carrier having coefficients of thermal expansion which are matched to one another.

6. A method according to claim 1, wherein the step of providing the metal clip provides the metal clip having legs thereon proceeding from a common starting point radially expanding in a downward direction to the foot portions, which are fastened to the carrier by the welding step.

7. A method according to claim 6, wherein the step of providing the clip, the tube and the carrier provides clips, tubes and carriers having a material which has matching coefficients of thermal expansion.

8. A method according to claim 1, wherein the steps of providing the carrier, the metal clip and the small metal tube provide a tube, clip and carrier having coefficients of thermal expansion matched to one another.

9. An arrangement for optically coupling an optical electronic component to an optical lens that is adjusted and fixed on a carrier in front of an optical electronic component, said arrangement comprising a carrier having an opto-electronic component mounted on a surface thereof, a lens being held in an end face of a small metal tube, a metal clip for holding the small metal tube on the carrier in an adjusted position with the lens positioned in front of the opto-electronic component, said clip being welded to the carrier and said metal tube together with the lens being secured in the metal clip by a spot welding between the clip and tube 10. An arrangement according to claim 9, wherein the optical lens is a component part of a light waveguide being held in the tube.

11. An arrangement according to claim 9, wherein the optical lens is a spherical lens mounted in the end of the tube.

12. An arrangement according to claim 9, wherein the opto-electronic component is a laser diode.

13. An arrangement according to claim 9, wherein the opto-electronic component is a phototransistor.

14. An arrangement according to claim 9, wherein the opto-electronic component is a photodiode.

15. An arrangement according to claim 9, wherein the component part is an opto-electronic transmission and/or reception module.

16. An arrangement according to claim 9, wherein the metal clip is shaped with legs thereof proceeding from a common starting point radially expanding in a downward direction to lateral flanges, which are welded to the carrier.

17. An arrangement according to claim 16, wherein the small metal tube, the metal clip and the carrier are of materials which care selected to have matching coefficients of thermal expansion.

18. An arrangement according to claim 16, wherein said clip is a sheet metal clip and the spot weld between the clip and tube is located at an edge of the sheet metal clip.

19. An arrangement according to claim 9, wherein the clip is a sheet metal clip and the spot weld is located between the tube and an edge of the clip.

* * * * *